United States Patent
Qi et al.

(10) Patent No.: US 10,981,304 B2
(45) Date of Patent: Apr. 20, 2021

(54) METHOD OF NANOSCALE PATTERNING BASED ON CONTROLLED PINHOLE FORMATION

(71) Applicant: OKINAWA INSTITUTE OF SCIENCE AND TECHNOLOGY SCHOOL CORPORATION, Okinawa (JP)

(72) Inventors: Yabing Qi, Kunigami-gun (JP); Luis Katsuya Ono, Kunigami-gun (JP)

(73) Assignee: OKINAWA INSTITUTE OF SCIENCE AND TECHNOLOGY SCHOOL CORPORATION, Okinawa (JP)

( * ) Notice: Subject to any disclaimer, the term of this patent is extended or adjusted under 35 U.S.C. 154(b) by 243 days.

(21) Appl. No.: 16/099,493

(22) PCT Filed: Jun. 1, 2017

(86) PCT No.: PCT/JP2017/020439
§ 371 (c)(1),
(2) Date: Nov. 7, 2018

(87) PCT Pub. No.: WO2017/213016
PCT Pub. Date: Dec. 14, 2017

(65) Prior Publication Data
US 2019/0105812 A1  Apr. 11, 2019

Related U.S. Application Data

(60) Provisional application No. 62/345,811, filed on Jun. 5, 2016.

(51) Int. Cl.
*B29C 41/12* (2006.01)
*B29C 33/38* (2006.01)
(Continued)

(52) U.S. Cl.
CPC .......... *B29C 41/12* (2013.01); *B29C 33/3857* (2013.01); *B29C 59/02* (2013.01);
(Continued)

(58) Field of Classification Search
CPC ....... B29C 41/12; B29C 59/02; B29C 59/022; B29C 2033/3864; B29C 2033/426;
(Continued)

(56) References Cited

U.S. PATENT DOCUMENTS 8,673,541 B2 *  3/2014  Xiao ............... G03F 7/0002
                                                        430/296
10,507,604 B2 * 12/2019  Jung ................ B29C 33/3857
(Continued)

FOREIGN PATENT DOCUMENTS

CN      104704425 A     6/2015
JP      2015-534721 A  12/2015
(Continued)

OTHER PUBLICATIONS

Extended Search Report dated Jul. 2, 2019, issued in counterpart EP Application No. 17810194.5 (11 pages).
(Continued)

*Primary Examiner* — Nahida Sultana
(74) *Attorney, Agent, or Firm* — Westerman, Hattori, Daniels & Adrian, LLP

(57) ABSTRACT

A method of nanoscale patterning is disclosed. The method comprises: mixing predetermined amounts of a first solvent and a second solvent to generate a solvent, the first solvent and the second solvent being immiscible with each other; dissolving a solute material in the solvent to generate a coating material, the solute material having solubility that is higher in the first solvent than in the second solvent; and applying the coating material onto a substrate to form a plurality of pinholes in the coating material. The formation
(Continued)

of the plurality of pinholes is associated with suspension drops mostly comprised of the second solvent, separated from the solute material dissolved in the first solvent, in the coating material. A method of making a stamp with a nanoscale pattern is also disclosed based on the above method.

18 Claims, 13 Drawing Sheets

(51) Int. Cl.
*H01L 51/00* (2006.01)
*B29C 59/02* (2006.01)
*B81C 99/00* (2010.01)
B82Y 30/00 (2011.01)
B82Y 40/00 (2011.01)
B29C 33/42 (2006.01)
H01L 51/42 (2006.01)
B01D 67/00 (2006.01)
B29L 31/00 (2006.01)

(52) U.S. Cl.
CPC .......... *B29C 59/022* (2013.01); *B81C 99/009* (2013.01); *H01L 51/0004* (2013.01); *H01L 51/0007* (2013.01); B01D 67/0011 (2013.01); B01D 67/0013 (2013.01); B29C 59/025 (2013.01); B29C 2033/3864 (2013.01); B29C 2033/426 (2013.01); B29L 2031/7562 (2013.01); B82Y 30/00 (2013.01); B82Y 40/00 (2013.01); H01L 51/4226 (2013.01); Y02P 70/50 (2015.11)

(58) Field of Classification Search
CPC . B29C 33/3857; B29C 59/025; B81C 99/009; H01L 51/0004; H01L 51/0007; H01L 51/4226; Y02P 70/50; B01D 67/0013; B01D 67/0011; B29L 2031/7562; B82Y 30/00; B82Y 40/00
See application file for complete search history.

(56) References Cited

U.S. PATENT DOCUMENTS

| | | | |
|---|---|---|---|
| 2004/0231781 A1* | 11/2004 | Bao | G03F 7/0002 156/230 |
| 2005/0258571 A1* | 11/2005 | Dumond | B27N 3/08 264/293 |
| 2009/0256287 A1* | 10/2009 | Fu | G03F 7/0757 264/447 |
| 2013/0299796 A1* | 11/2013 | Masuyama | B81C 1/00031 257/40 |
| 2015/0028325 A1* | 1/2015 | Seki | B82Y 10/00 257/40 |
| 2015/0056399 A1 | 2/2015 | Takeoka et al. | |
| 2015/0064057 A1* | 3/2015 | Grigoropoulos | C23C 18/143 420/441 |
| 2015/0217505 A1 | 8/2015 | Fischer et al. | |
| 2018/0311877 A1* | 11/2018 | Saifullah | C25D 1/10 |
| 2019/0112186 A1* | 4/2019 | Jang | B29C 59/022 |

FOREIGN PATENT DOCUMENTS

| | | |
|---|---|---|
| WO | 2006/030964 A1 | 3/2006 |
| WO | 2009/041376 A1 | 4/2009 |

OTHER PUBLICATIONS

Zhang, Jie et al., "Low-cost fabrication of large area sub-wavelength anti-reflective structures on polymer film using a soft PUA mold", Optics Express, vol. 22, No. 2, Jan. 21, 2014, 10 pages; Cited in Extended EP Search Report dated Jul. 2, 2019.
Sainiemi, L. et al., "Fabrication of nanoperforated silicon membranes with tunable sized high aspect ratio holes", Transducers 2009, Jun. 21, 2009, pp. 200-203; Cited in Extended EP Search Report dated Jul. 2, 2019.
International Search Report dated Aug. 15, 2017, issued in counterpart application No. PCT/JP2017/020439 (3 pages).
Witten Opinion dated Aug. 15, 2017, issued in counterpart application No. PCT/JP2017/020439 (3 pages).
Hawash et al., "Air-Exposure Induced Dopant Redistribution and Energy Level Shifts in Spin-Coated Spiro-MeOTAD Films", Chemistry of Materials, 2015, vol. 27, pp. 562-569, Cited in Specification and ISR (9 pages).
Perl et al., "Microcontact Printing: Limitations and Achievements", Advanced Materials, 2009, vol. 21, pp. 2257-2268, Cited in Specification (12 pages).
Chuang et al., "Self-Assembled Nanoscale Ring Arrays from a Polystyrene-b-polyferrocenylsilane-b-poly(2-vinylpyridine) Triblock Terpolymer Thin Film", Advanced Materials, 2009, vol. 21, pp. 3789-3793 and Supporting Information, Cited in Specification (9 pages).
Huang et al., "Polymer blend lithography for metal films: large-area patterning with over 1 billion holes/inch$^2$", Beilstein Journal of Nanotechnology, 2015, vol. 6, pp. 1205-1211, Cited in Specification (7 pages).
Office Action dated Apr. 16, 2020, issued in counterpart CN application No. 201780031415.7, with English translation. (12 pages).
Office Action dated Feb. 16, 2021, issued in counterpart Japanese Application No. 2018-563535 (8 pages; w/ English translation).

\* cited by examiner

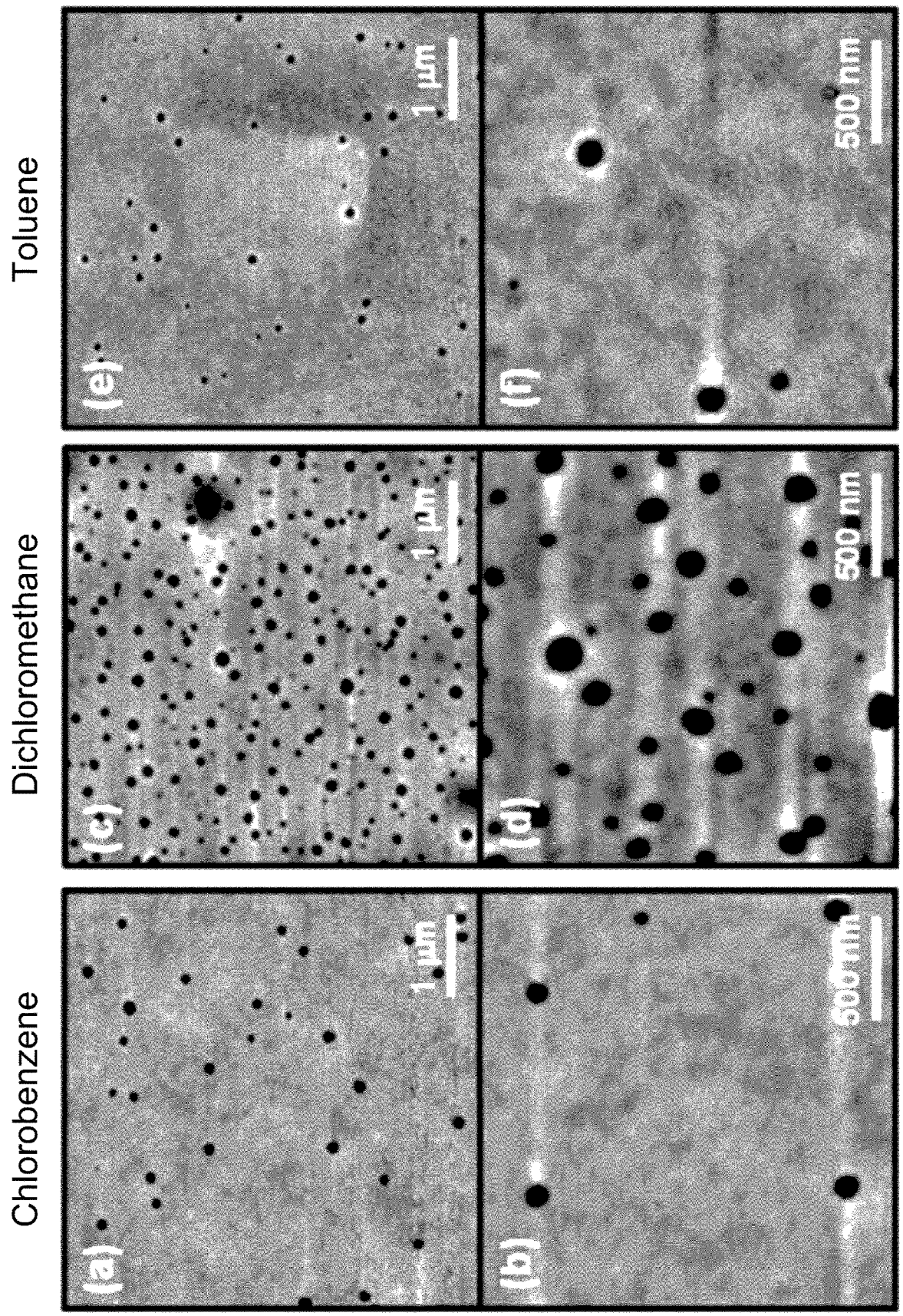
[Fig. 1]

[Fig. 2]
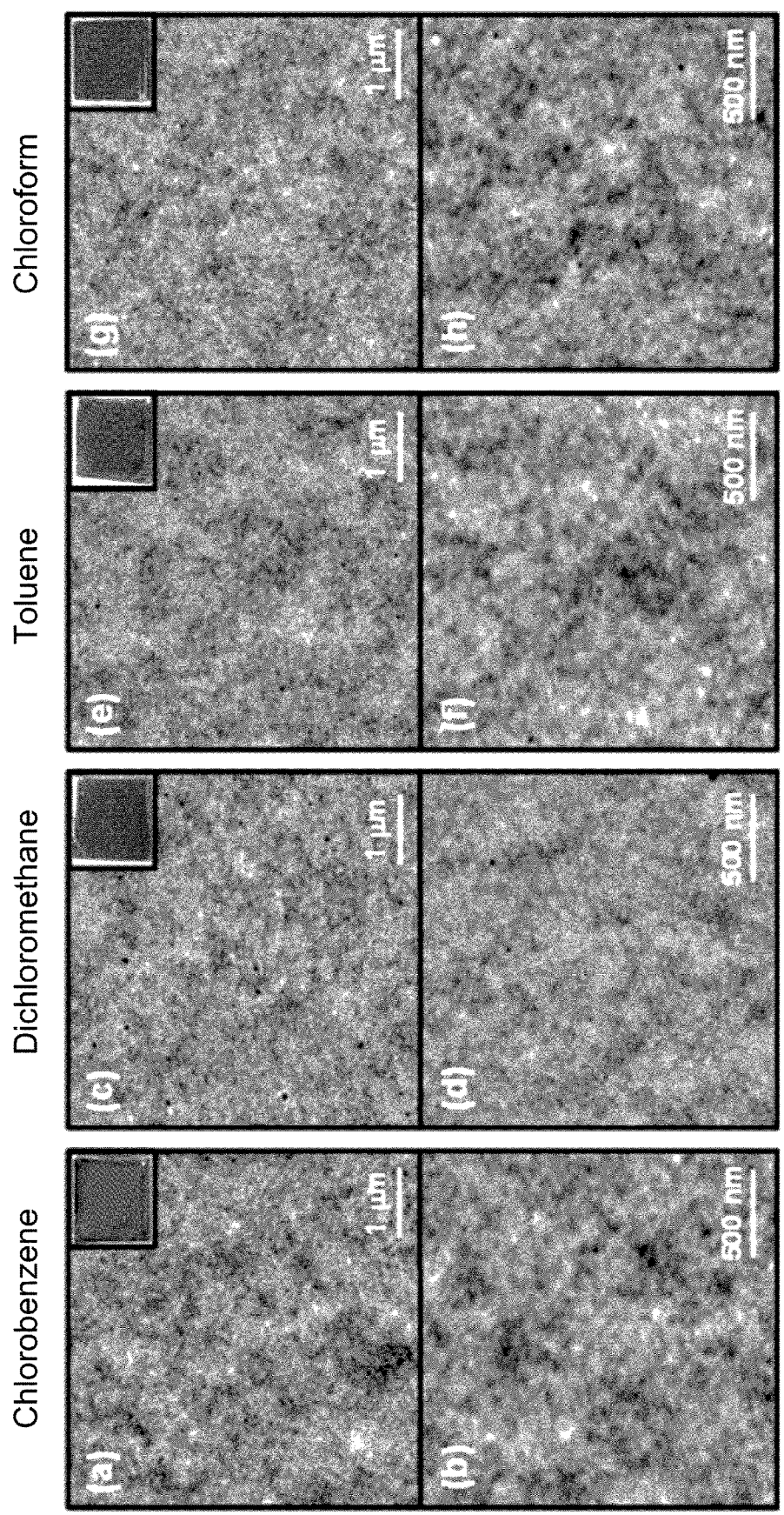

[Fig. 3]
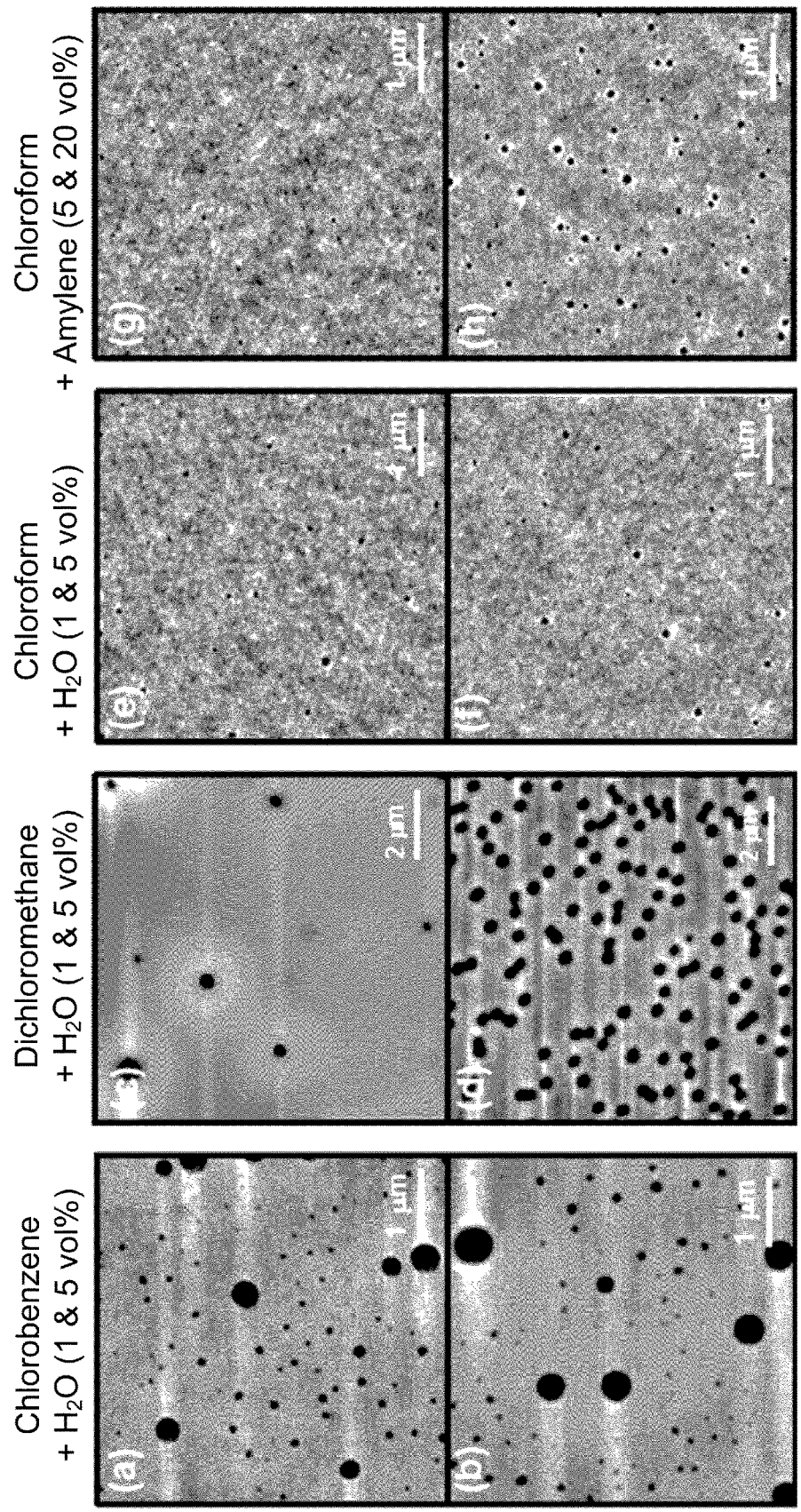

[Fig. 4]
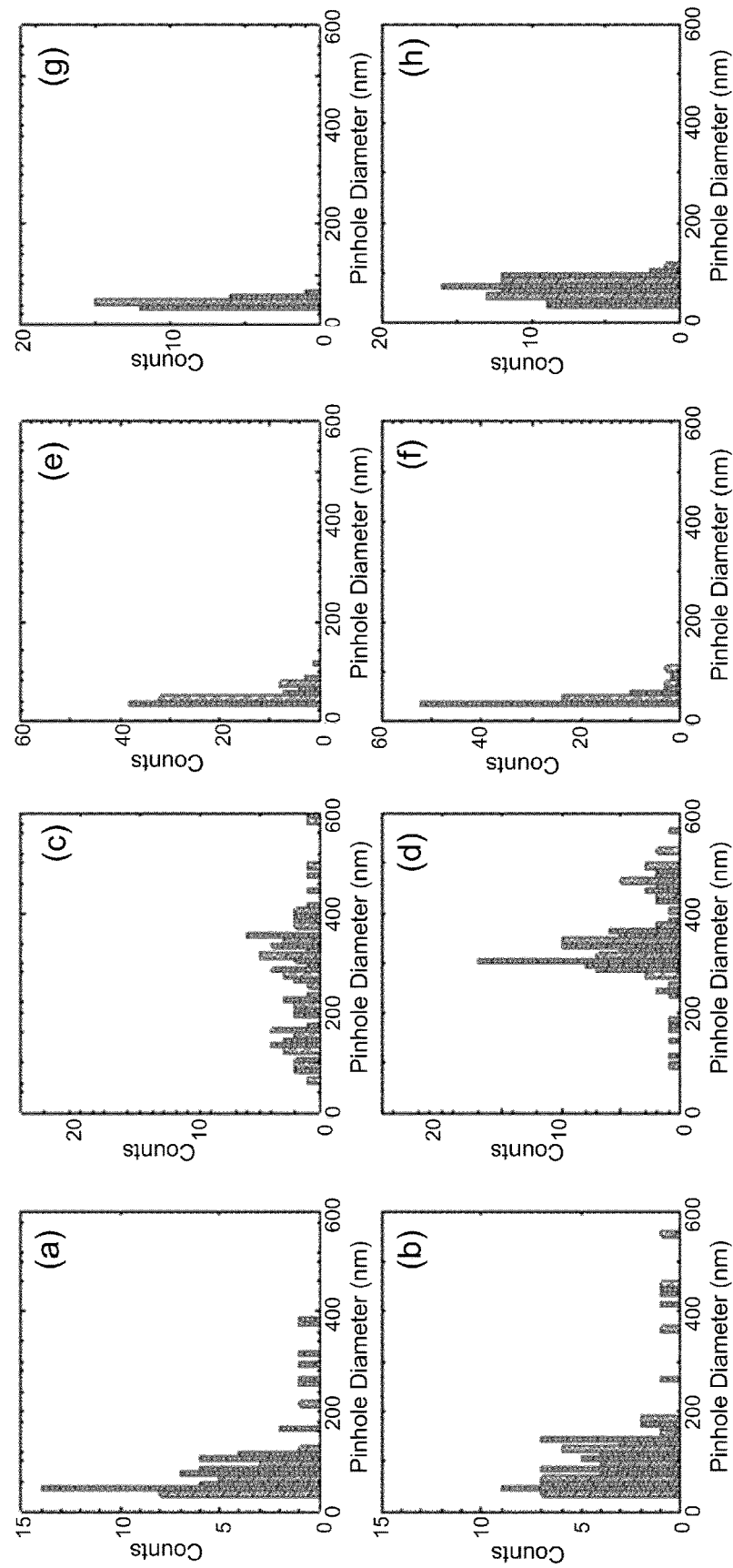

[Fig. 5]
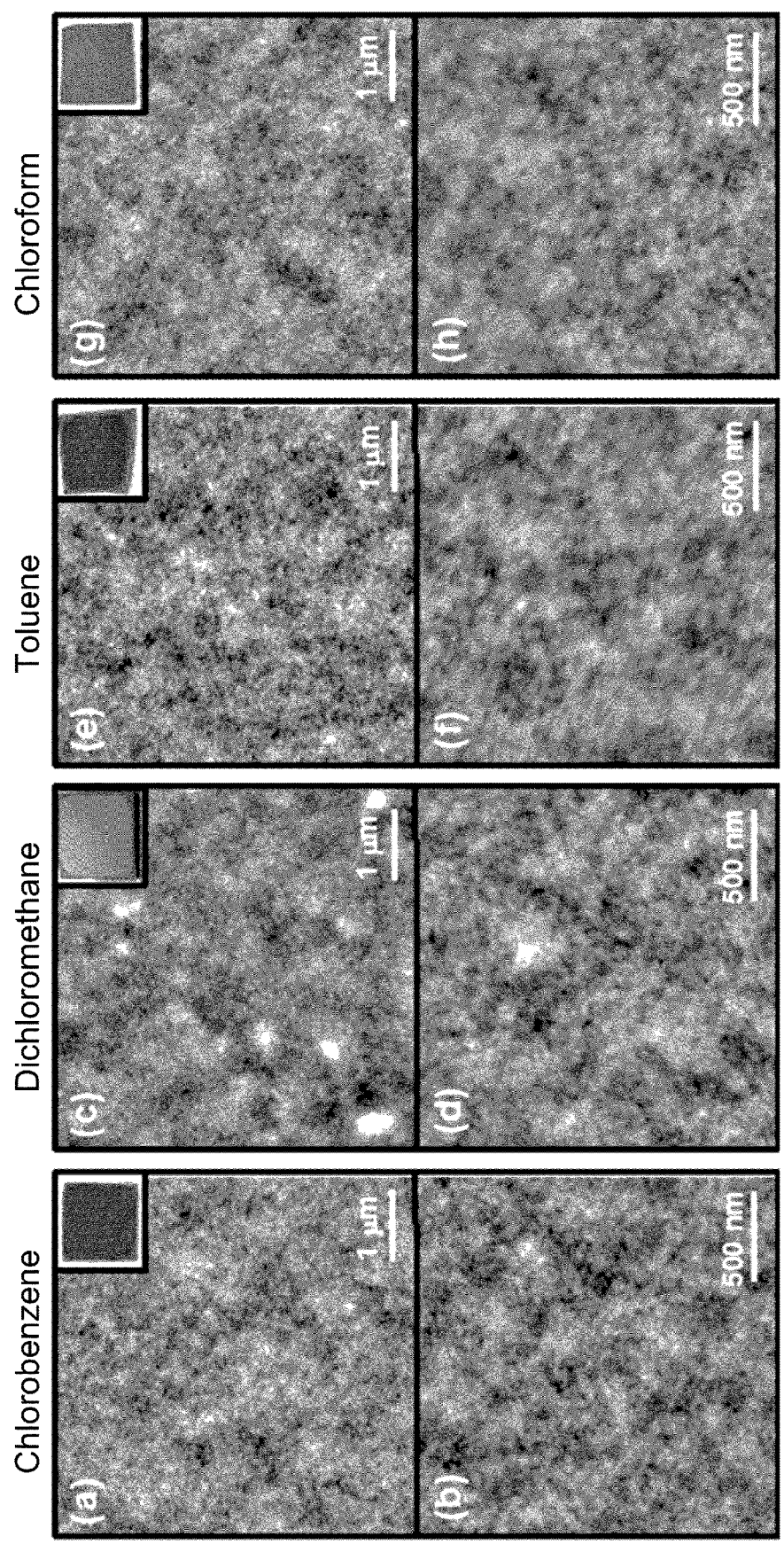

[Fig. 6]
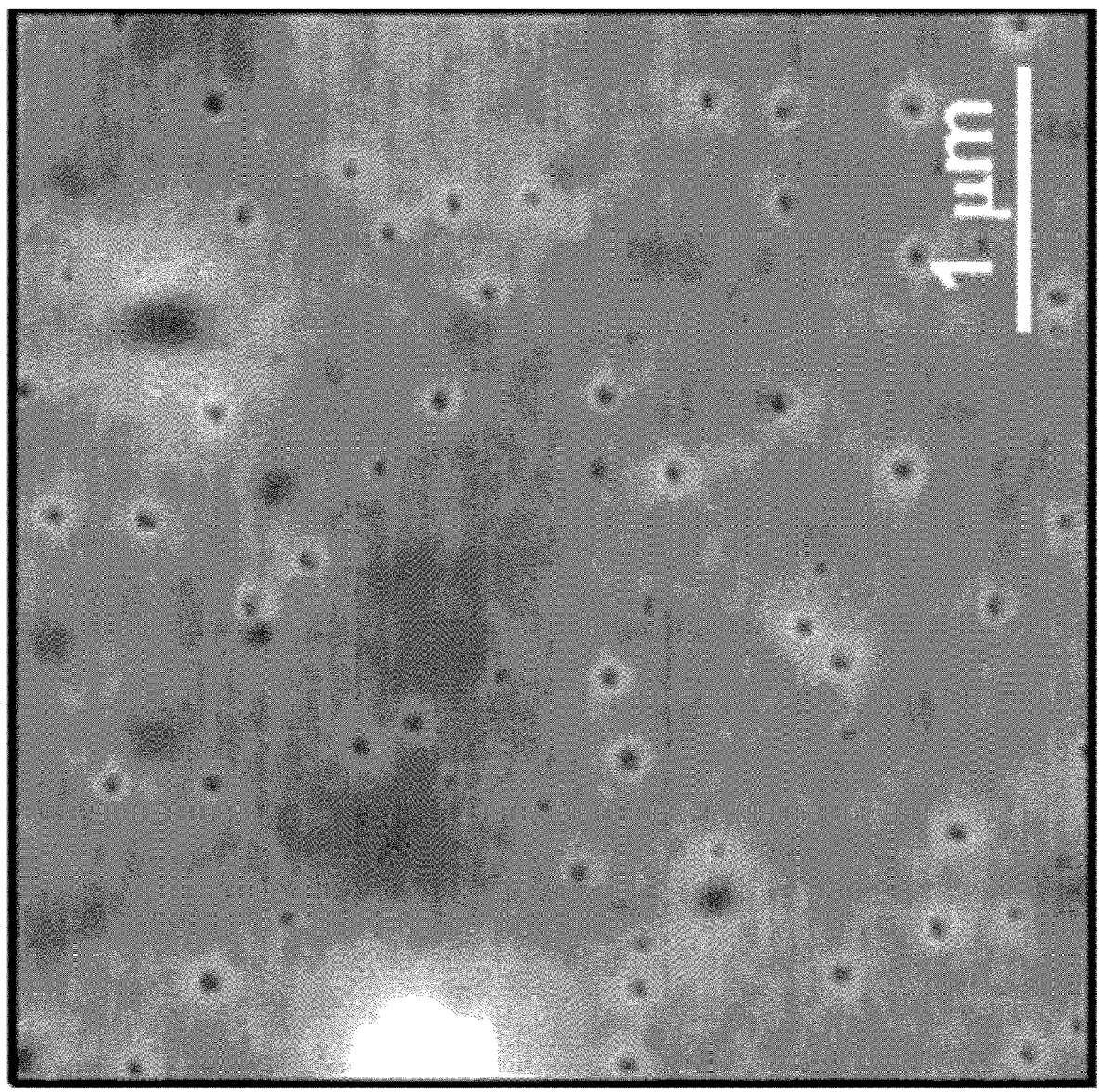

[Fig. 7]
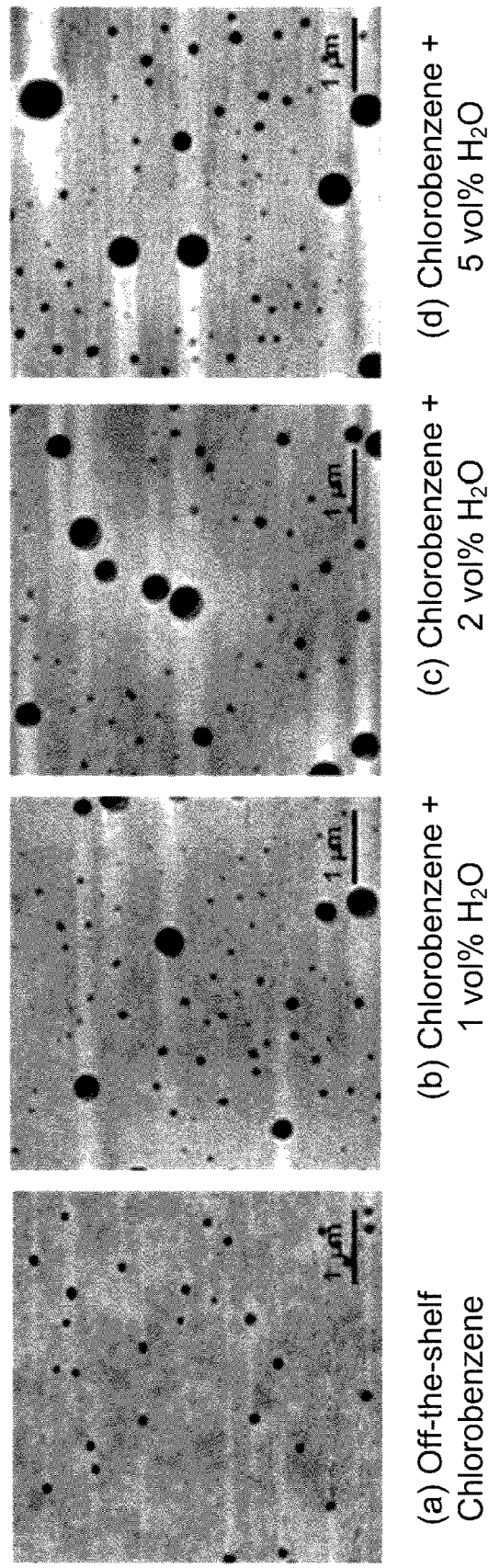

[Fig. 8]
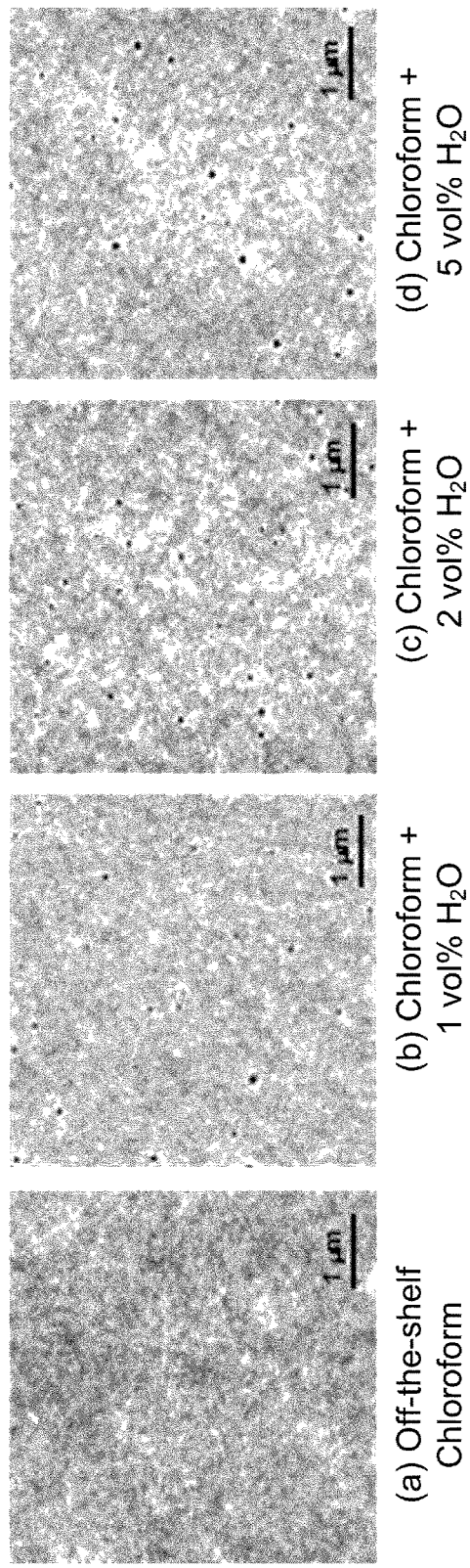

[Fig. 9]
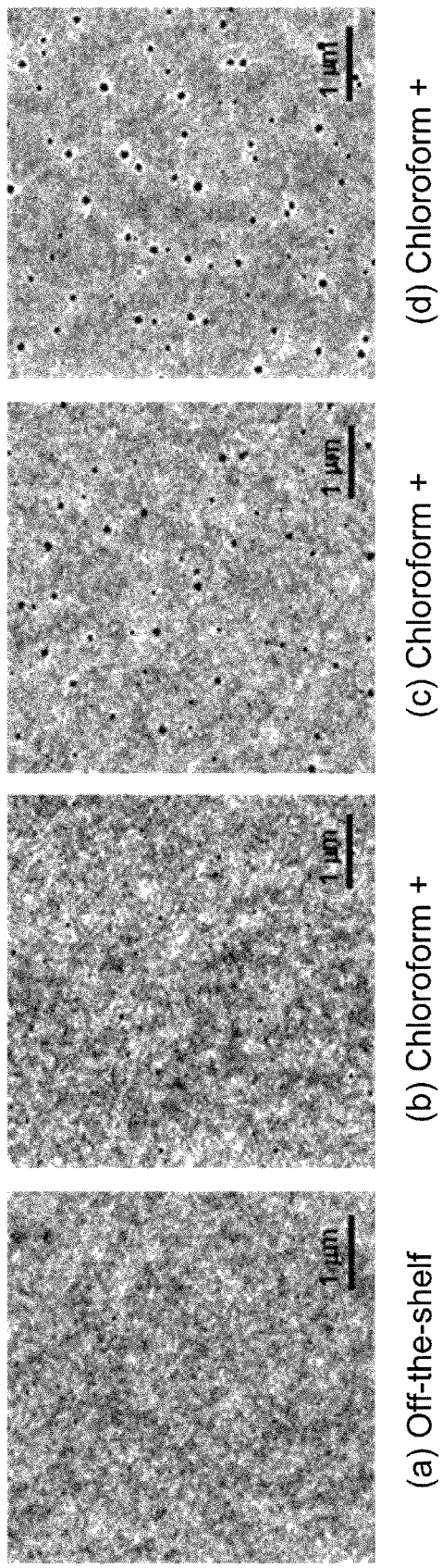

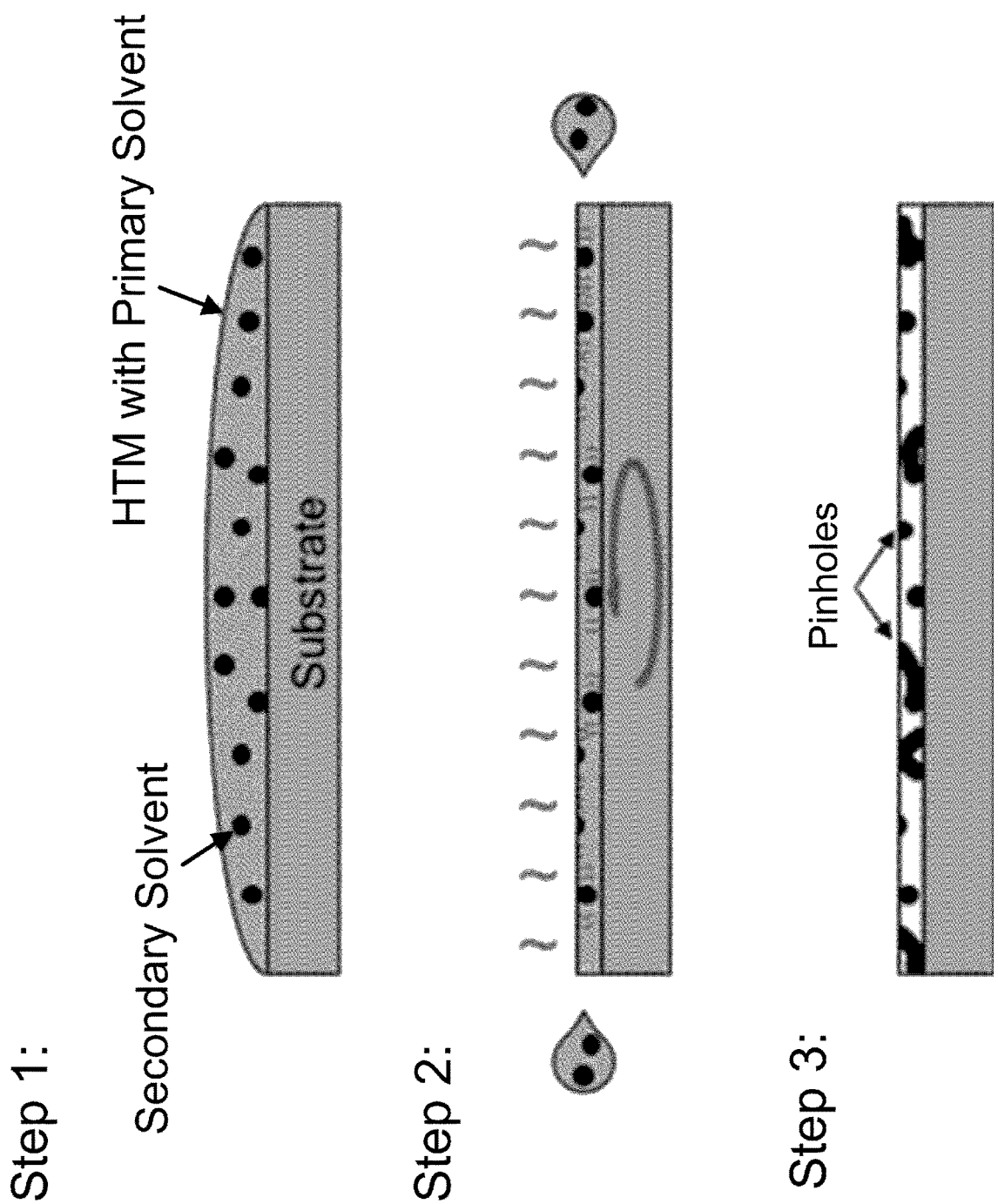
[Fig. 10]

[Fig. 11]
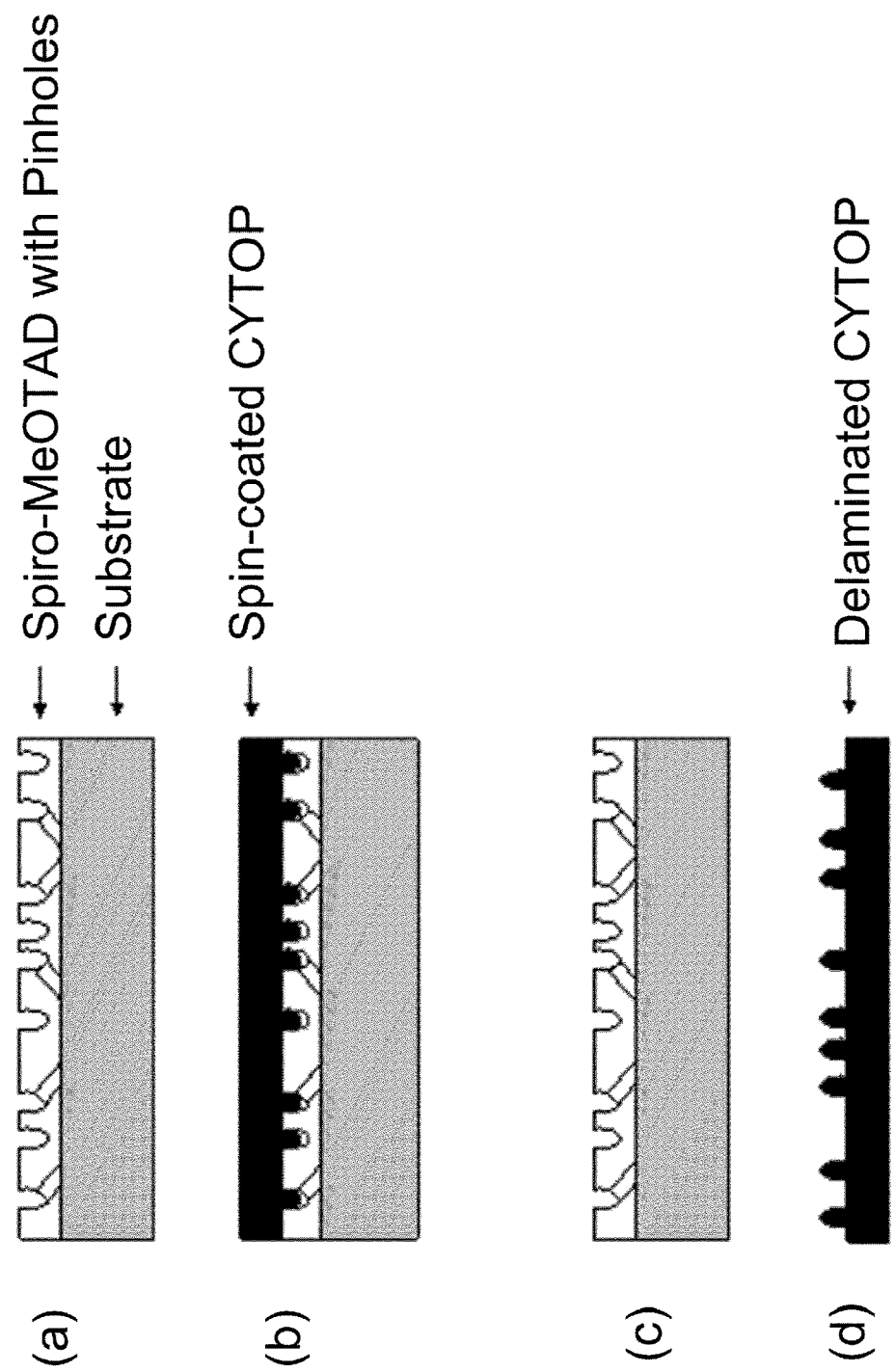

[Fig. 12]
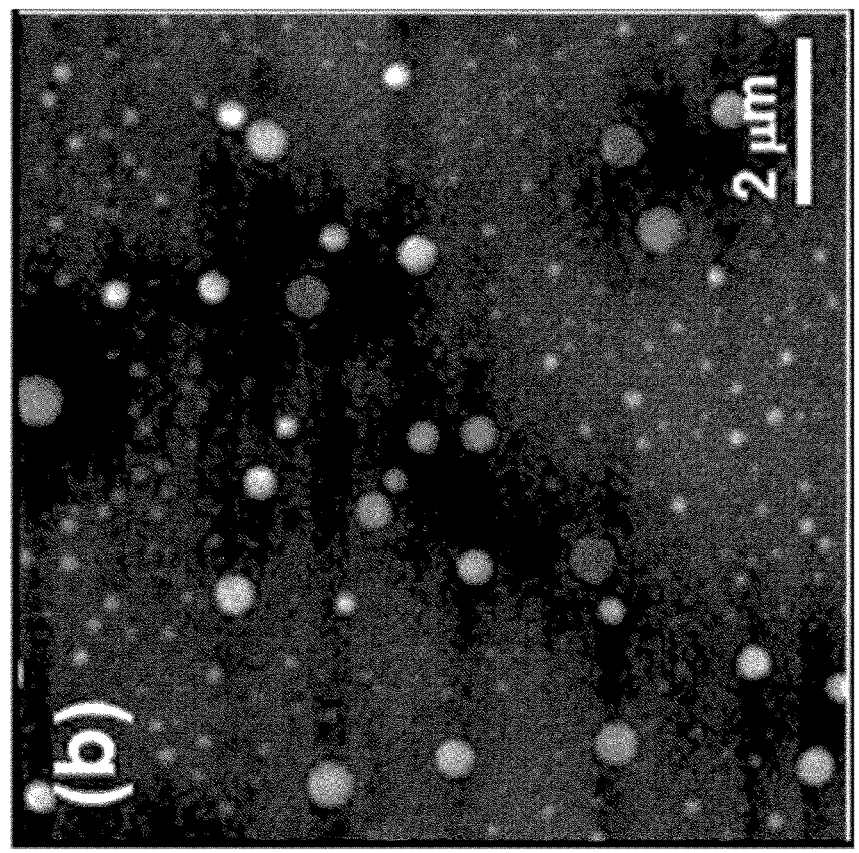
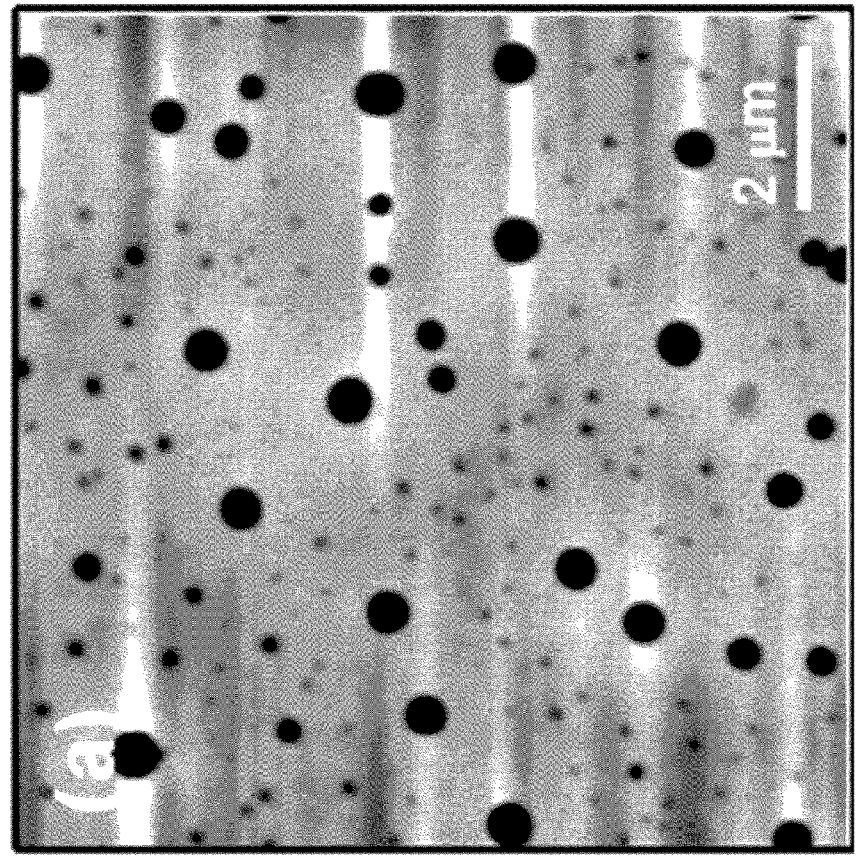

[Fig. 13]
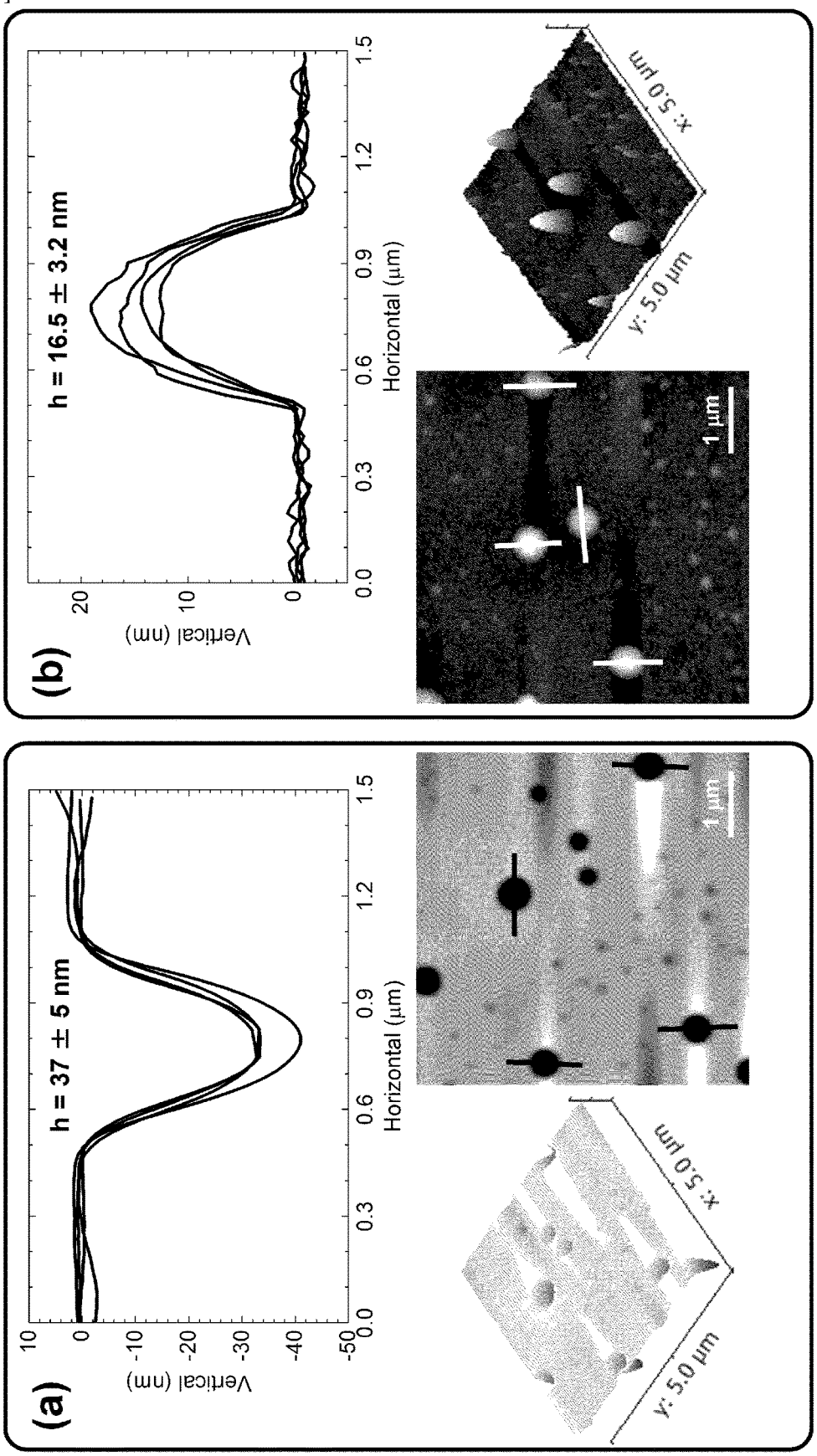

METHOD OF NANOSCALE PATTERNING BASED ON CONTROLLED PINHOLE FORMATION

TECHNICAL FIELD

The present invention relates to a method of forming nanoscale patterns based on controlled pinhole formation in a hole transport material used for perovskite optoelectronic devices.

BACKGROUND ART

A solar cell (also called a photovoltaic cell) is an electrical device that converts solar energy into electricity by using semiconductors that exhibit the photovoltaic effect. Solar photovoltaics is now, after hydro and wind power, the third most important renewable energy source in terms of globally installed capacity. Constructions of these solar cells are based around the concept of a p-n junction, wherein photons from the solar radiation are converted into electron-hole pairs. Examples of semiconductors used for commercial solar cells include monocrystalline silicon, polycrystalline silicon, amorphous silicon, cadmium telluride, and copper indium gallium diselenide. Solar cell energy conversion efficiencies for commercially available cells are currently reported to be around 14-22%.

High conversion efficiency, long-term stability and low-cost fabrication are essential for commercialization of solar cells. For this reason, a wide variety of materials have been researched for the purpose of replacing conventional semiconductors in solar cells. For example, the solar cell technology using organic semiconductors is relatively new, wherein these cells may be processed from liquid solution, potentially leading to inexpensive, large scale production. Besides organic materials, organometal halide perovskites, $CH_3NH_3PbX_3$ and $CH_3NH_3SnX_3$, where X=Cl, Br, I or a combination thereof, for example, have recently emerged as a promising material for the next generation of high efficiency, low cost solar technology. It has been reported that these synthetic perovskites can exhibit high charge carrier mobility and lifetime that allow light-generated electrons and holes to move far enough to be extracted as current, instead of losing their energy as heat within the cell. These synthetic perovskites can be fabricated by using the same thin-film manufacturing techniques as those used for organic solar cells, such as solution processing, vacuum evaporation techniques, chemical vapor deposition, etc.

A hole transport layer (HTL) can be used as a medium for transporting hole carriers from the perovskite active layer to an electrode in the photovoltaic device. A solution method is typically employed to form a HTL for a perovskite optoelectronic device. For example, the solution of spiro-MeOTAD may be spin-coated to form the HTL on a perovskite film. However, a recent study revealed that these solution-processed films made of spiro-MeOTAD typically include pinholes with a high density.

In perovskite optoelectronics devices, the pinholes generated in the HTL are defects degrading device performances. However, the present studies described in this document demonstrate that the formation of pinholes can be controlled and positively utilized for practical applications, including: patterning and functionalization of surfaces, formation of membranes that allow certain sizes of particles to go through, and other nanoscale patterning applications.

CITATION LIST

Non Patent Literature

NPL1: Z. Hawash et al., Air-exposure induced dopant redistribution and energy level shifts in spin-coated spiro-MeOTAD films, Chem. Mater. 27, pp. 562-569 (2015).

NPL2: A. Perl, Microcontact printing: limitations and achievements, Adv. Mater. 21, pp. 2257-2268 (2009).

NPL3: V. P. Chuang et al., Self-assembled nanoscale ring arrays from a polystyrene-polyferrocenylsilane-b-poly(2-vinylpyridine) triblock terpolymer thin film, Adv. Mater. 21, pp. 3789-3793 and Supporting Information (2009).

NPL4: C. Huang et al., Polymer blend lithography for metal films: large area patterning with over 1 billion holes/inch$^2$, Belistein J. Nanotehnol. 6, pp. 1205-1211 (2015).

Patent Literature

PL1: Takeoka et al., US 2015/0056399A1

SUMMARY OF INVENTION

A method of nanoscale patterning is disclosed. The method comprises: mixing predetermined amounts of a first solvent and a second solvent to generate a solvent, the first solvent and the second solvent being immiscible with each other; dissolving a solute material in the solvent to generate a coating material, the solute material having solubility that is higher in the first solvent than in the second solvent; and applying the coating material onto a substrate to form a plurality of pinholes in the coating material. The formation of the plurality of pinholes is associated with suspension drops mostly comprised of the second solvent, separated from the solute material dissolved in the first solvent, in the coating material. A method of making a stamp with a nanoscale pattern is based on the above method and includes: applying a replicating material onto the coating material containing the plurality of pinholes to replicate a pattern of a surface of the coating material containing the plurality of pinholes onto a surface of the replicating material; and delaminating the replicating material from the coating material. The delaminated replicating material is then configured for use for a stamp, by attaching a support plate to the back surface, for example.

BRIEF DESCRIPTION OF DRAWINGS

FIG. 1 shows the tapping mode AFM topography images with each image size 5×5 μm$^2$ of the spin-coated spiro-MeOTAD films on the Si substrates, prepared by using chlorobenzene, dichloromethane and toluene for the primary solvents, respectively, in (a), (c) and (e); and the tapping mode AFM topography images with each image size 2×2 μm$^2$ of the spin-coated spiro-MeOTAD films on the Si substrates, prepared by using chlorobenzene, dichloromethane and toluene, respectively, in (b), (d) and (f). The solvents were purchased from supplier A.

FIG. 2 shows the tapping mode AFM topography images with each image size 5×5 μm$^2$ of the spin-coated spiro-MeOTAD films on the Si substrates, prepared by using chlorobenzene, dichloromethane, toluene and chloroform, respectively, in (a), (c), (e) and (g); and the tapping mode AFM topography images with each image size 2×2 μm$^2$ of the spin-coated spiro-MeOTAD films on the Si substrates, prepared by using chlorobenzene, dichloromethane, toluene and chloroform, respectively, in (b), (d), (f) and (h). The solvents were purchased from supplier B.

FIG. 3 shows the tapping mode AFM topography images of the spin-coated spiro-MeOTAD films, prepared by using chlorobenzene from supplier A to which 1 vol % and 5 vol % of deionized water was added, in (a) and (b), respectively; using dichloromethane from supplier B to which 1 vol % and 5 vol % of deionized water was added, in (c) and (d), respectively; using chloroform from supplier B to which 1 vol % and 5 vol % of deionized water was added, in (e) and (f), respectively; and using chloroform from supplier B to which 5 and 20 vol% of amylene (2-methyl-2-butene) was added, in (g) and (h), respectively.

FIG. 4 shows histograms depicting the trends in the distribution of pinhole diameters in the samples when a secondary solvent of $H_2O$ or amylene was added intentionally in a primary solvent of chlorobenzene, dichloromethane or chloroform. The histograms in FIG. 4(a)-(h) correspond to the AFM images in FIG. 3(a)-(h), respectively.

FIG. 5 shows the tapping mode AFM topography images with each image size of 5×5 μm² of the spin-coated polystyrene films prepared by using chlorobenzene, dichloromethane, toluene and chloroform, respectively, in (a), (c), (e) and (g); and the tapping mode AFM topography images with each image size of 2×2 μm² of the spin-coated polystyrene films prepared by using chlorobenzene, dichloromethane, toluene and chloroform, respectively, in (b), (d), (f) and (h). The solvents were purchased from supplier B.

FIG. 6 shows the tapping mode AFM topography image with the image size 5×5 μm² of the spin-coated polystyrene film prepared by using chlorobenzene from supplier A.

FIG. 7 shows a series of the AFM images, with each image size 5×5 μm², of the spin-coated spiro-MeOTAD films prepared by using an off-the-shelf chlorobenzene product (from supplier A) as the solvent in (a), the chlorobenzene plus 1 vol % deionized-water in (b), the chlorobenzene plus 2 vol % deionized-water in (c), and the chlorobenzene plus 5 vol % deionized-water in (d).

FIG. 8 shows a series of the AFM images, with each image size 5×5 μm², of the spin-coated spiro-MeOTAD films prepared by using an off-the-shelf chloroform product (from supplier B) as the solvent in (a), the chloroform plus 1 vol % deionized-water in (b), the chloroform plus 2 vol % deionized-water in (c), and the chloroform plus 5 vol % deionized-water in (d).

FIG. 9 shows a series of the AFM images, with each image size 5×5 μm², of the spin-coated spiro-MeOTAD films prepared by using an off-the-shelf chloroform product (from supplier B, super dehydrated) as the solvent in (a), the chloroform plus 5 vol % amylene in (b), the chloroform plus 10 vol % amylene in (c), and the chloroform plus 20 vol % amylene in (d).

FIG. 10 illustrates a process sequence, Step 1-Step 3, schematically depicting the mechanism for the formation of pinholes.

FIG. 11 illustrates a process of spin-coating CYTOP as a replicating material on the spiro-MeOTAD layer that has pinholes.

FIG. 12 shows the tapping mode AFM topography images of the spiro-MeOTAD film containing pinholes in (a), which was formed according to the process illustrated in FIG. 10, and a replica of the pinhole structure transferred to the CYTOP film in (b), which was formed according to the process illustrated in FIG. 11.

FIG. 13 shows example results of the AFM analyses of hole depths in the spiro-MeOTAD film containing pinholes in (a) and rod heights in the replica made in the CYTOP film in (b).

DESCRIPTION OF EMBODIMENTS

Source materials for fabricating an organometal halide perovskite film include halide materials such as $PbCl_2$, $PbBr_2$, $PbI_2$, $SnCl_2$, $SnBr_2$, $SnI_2$ and the like, and methylammonium ($MA=CH_3NH_3^+$) compounds such as $CH_3NH_3Cl$, $CH_3NH_3Br$, $CH_3NH_3I$, and the like. In place of, or in a combination with the MA compound, a formamidinium ($FA=HC(NH_2)_2^+$) compound can also be used. Organometal halide perovskites have the orthorhombic structure generally expressed as $ABX_3$, in which an organic element, MA, FA or other suitable organic element, occupies each site A; a metal element, $Pb^{2+}$ or $Sn^{2+}$, occupies each site B; and a halogen element, $Cl^-$, $I^-$ or $Br^-$, occupies each site X. Source materials are denoted as AX and $BX_2$, where AX represents an organic halide compound having an organic element MA, FA or other suitable organic element for the A-cation combined with a halogen element Cl, I or Br for the X-anion; $BX_2$ represents a metal halide compound having a metal element Pb or Sn for the B-cation combined with a halogen element Cl, I or Br for the X-anion. Here, the actual element X in the AX and the actual element X in the $BX_2$ can be the same or different, provided that each is selected from the halogen group. For example, X in the AX can be Cl, while X in the $BX_2$ can be Cl, I or Br. Accordingly, formation of a mixed perovskite, e.g., $MAPbI_{3-X}Cl_X$, is possible. The terms "perovskite" and "organometal halide perovskite" are used interchangeably and synonymously in this document.

Organometal halide perovskite can be used for an active layer in an optoelectronic device, such as a solar cell, LED, laser, etc. Here, the "active layer" refers to an absorption layer where the conversion of photons to charge carriers (electrons and holes) occurs in a photovoltaic device; for a photo-luminescent (i.e., light-emitting) device, it refers to a layer where charge carriers are combined to generate photons.

A hole transport layer (HTL) can be used as a medium for transporting hole carriers from the active layer to an electrode in the photovoltaic device; for a photo-luminescent device, the HTL refers to a medium for transporting hole carriers from an electrode to the active layer. Examples of hole transport materials (HTMs) for use for forming HTLs in perovskite-based devices include but not limited to: 2,2',7,7'-tetrakis(N,N'-di-p-methoxyphenylamine)-9,9'-spirobifluorene (spiro-MeOTAD, also called spiro-OMeTAD), poly(3-hexylthiophene-2,5-diyl) (P3HT), poly(triaryl amine) (PTAA), graphene oxide, nickle oxide, poly(3,4-ethylenedioxythiophene) polystyrene sulfonate (PEDOT: PSS), copper thiocyanate (CuSCN), CuI, $Cs_2SnI_6$, alpha-NPD, $Cu_2O$, CuO, subphthalocyanine, 6,13-bis(triisopropylsilylethynyl) pentacene (TIPS-pentacene), PCPDTBT, PCDTBT, OMeTPA-FA, OMeTPA-TPA, and quinolizino acridine.

A solution method is typically employed to form a HTL for a perovskite-based device. For example, the solution of spiro-MeOTAD with 4-tert-butylpyridine (tBP) and lithium bis-(trifluoromethylsulfonyl)imide salt (Li-salt) may be spin-coated to form the HTL on a perovskite film. However, a recent study described in Hawash et al. (NPL1) revealed that these solution-processed films made of spiro-MeOTAD typically include pinholes with a high density. Here, a pinhole is defined as a defect having a shape of a hole with a small diameter penetrating in the film. These pinholes may penetrate through the entire thickness of the film or deeply into the film starting from the film surface. Such pinholes in the HTL can cause instability of perovskite-based devices, via shortening or mixing of layers, which is likely the reason why a typical perovskite solar cell using a solution-processed spiro-MeOTAD film for forming the HTL shows rapidly reduced efficiency when exposed to air. Such pinholes are also likely the cause for the very short lifetime of typical perovskite solar cells, which include solution-processed spiro-MeOTAD for the HTL. It is considered that the effects arising from the pinhole formation is twofold: (i) pinholes facilitate moisture migration through the HTL to reach and degrade the perovskite; (ii) pinholes facilitate component elements, e.g., iodine, to migrate from the perovskite to the top surface, thereby degrading or decomposing the perovskite.

In view of the above problems associated with the formation of pinholes, this document describes experiments and analyses, which show that the formation of pinholes can be controlled by the presence of a secondary solvent (e.g. water, stabilizer additive) in the primary solvent. The possibility to form pinholes in a controlled manner, e.g., by intentionally adding a secondary solvent, may open venue for some interesting applications. Such application may include: patterning and functionalization of surfaces, formation of membranes that allow certain sizes of particles to go through, and other nanoscale patterning applications. In the following, spiro-MeOTAD is used as a specific HTM example; however, the present methodology is applicable to other types of HTMs such as those listed earlier. Details are described below with reference to accompanying drawings. Although specific values are cited herein to explain various steps, experiments and results as examples, it should be understood that these are approximate values and/or within instrumental tolerances or resolutions.

In the present experiments, Si wafers with a native oxide were used as substrates because of the flatness (surface roughness root-mean square, RMS~0.1 nm) useful to visualize and characterize pinholes by atomic force microscopy (AFM). It should be noted that the pinhole formation is not majorly influenced by the type of substrate, and thus the results from the present experiments are qualitatively applicable even when other types of substrates are used. Four different solvents, chlorobenzene, chloroform, dichloromethane and toluene, purchased from commercial suppliers were used as primary solvents in the present experiments.

HTM solutions were prepared specifically as follows. 72.5 mg of spiro-MeOTAD was dissolved in 1 mL of each of four primary solvents (chlorobenzene, chloroform, dichloromethane, and toluene), corresponding to concentration of 59.2 mM (millimolar=$10^{-3}$ mol/L) and 60 μL of solution. The solution was spin-coated at 2000 rpm for 60 seconds on Si substrates, each of which has a surface area of ~1×1 cm². AFM was used to characterize morphologies of the resultant films. Si(100) wafers covered with a native oxide having 0.013 Ω·cm were used as substrates. The solvents were purchased from different commercial suppliers; however, the method for preparing the solution was the same for all the cases. From supplier A, chlorobenzene anhydrous 99.8%, dichloromethane anhydrous>99.8%, 40-150 ppm amylene as a stabilizer, and toluene anhydrous 99.8% were purchased. From supplier B, chlorobenzene mono, dichloromethane super dehydrate, toluene super dehydrated, and chloroform super dehydrated were purchased. The film thickness was determined based on the AFM measurements by mapping the height differences in a region of the spiro-MeOTAD film with a thin scratch made with a surgery knife. The same systematic experiments were also performed by using polystyrene as the HTM having Mw~350,000 and Mn~170,000, where Mw stands for "weight average molecular weight" and Mn stands for "number average molecular weight." 32.4 mg of polystyrene was dissolved in 2 mL of each of the four different primary solvents.

A small amount of a secondary solvent was added in the primary solvents systematically. The secondary solvents used in the present experiments are: deionized water having 18 MΩ·cm and 2-methyl-2-butene having the amylene concentration of greater than 99%, purified by redistillation.

FIG. 1 shows the AFM topography images of three samples of spiro-MeOTAD films, wherein the spiro-MeOTAD solutions were prepared by dissolving in chlorobenzene, dichloromethane and toluene solvents, all purchased from supplier A, and spin-coated on the Si substrates. Specifically, FIG. 1 shows the tapping mode AFM topography images with each image size 5×5 μm² of the spin-coated spiro-MeOTAD films on the Si substrates, prepared by using chlorobenzene, dichloromethane and toluene for the primary solvents, respectively, in (a), (c) and (e); and the tapping mode AFM topography images with each image size 2×2 μm² of the spin-coated spiro-MeOTAD films on the Si substrates, prepared by using chlorobenzene, dichloromethane and toluene, respectively, in (b), (d) and (f).

Large variations in pinholes density and sizes can be clearly seen in FIG. 1, depending on the solvents used to dissolve spiro-MeOTAD. Detailed analyses indicated that the pinhole formation, exemplified in FIG. 1, is un-correlated with intrinsic physico-chemical properties of the different solvents. Some of the basic properties of chlorobenzene, toluene, chloroform and dichloromethane non-polar solvents are tabulated in Table 1 below. Note that the specific gravity in this table is defined with respect to $H_2O=1$.

TABLE 1

| Solvent | Molecular structure | Boiling point (°C.) | Molecular weight (g/mol) | Density (g/mL) | Specific gravity | Viscosity at 25° C. (mPa · s) | Dipole moment (D) |
|---|---|---|---|---|---|---|---|
| Chlorobenzene ($C_6H_5Cl$) | 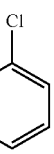 | 132 | 112.56 | 1.11 | 1.11 | 0.753 | 1.54 |

TABLE 1-continued

| Solvent | Molecular structure | Boiling point (° C.) | Molecular weight (g/mol) | Density (g/mL) | Specific gravity | Viscosity at 25° C. (mPa · s) | Dipole moment (D) |
|---|---|---|---|---|---|---|---|
| Toluene ($C_7H_8$) | $CH_3$—C$_6$H$_5$ | 111 | 92.14 | 0.87 | 0.87 | 0.590 | 0.36 |
| Chloroform ($CHCl_3$) | H–CCl$_3$ | 61.2 | 119.38 | 1.50 | 1.50 | 0.542 | 1.04 |
| Dichloromethane ($CH_2Cl_2$) | Cl–CH$_2$–Cl | 39.6 | 84.93 | 1.33 | 1.33 | 0.413 | 1.60 |

Based on the absence of notable correlations between the typical physico-chemical properties of the solvents and the observed pinhole formation, it may be concluded that the qualitative aspects of the pinhole formation are not related to intrinsic properties of the different solvent types, but vary depending on supplier's specified grades, degradation with storage time (i.e., shelf life), impurities introduced from solutes, and/or other extrinsic factors.

Another set of samples were prepared by dissolving spiro-MeOTAD in the same three types of solvents (chlorobenzene, dichloromethane and toluene), but purchased from supplier B. In addition, chloroform (from supplier B), which is another widely used solvent in organic electronics was included in the studies. FIG. 2 shows the tapping mode AFM topography images with each image size 5×5 µm² of the spin-coated spiro-MeOTAD films on the Si substrates, prepared by using chlorobenzene, dichloromethane, toluene and chloroform, respectively, in (a), (c), (e) and (g); and the tapping mode AFM topography images with each image size 2×2 µm² of the spin-coated spiro-MeOTAD films on the Si substrates, prepared by using chlorobenzene, dichloromethane, toluene and chloroform, respectively, in (b), (d), (f) and (h).

The degree of pinhole formation in FIG. 2 is significantly reduced compared to FIG. 1. Surface roughness root-mean square (RMS) values of (a) 0.22 nm, (b) 0.20 nm, (c) 0.21 nm, (d) 0.23 nm, (e) 0.22 nm, (f) 0.21 nm, (g) 0.19 nm, and (h) 0.18 nm were extracted, and an average RMS value of 0.21±0.02 nm was extracted for the spiro-MeOTAD films in the absence of pinholes. The RMS value of 0.12±0.02 nm was previously reported for the spiro-MeOTAD films deposited by vacuum evaporation, indicating that similar film morphology was obtained by using these two different methods. Photos of the spiro-MeOTAD films on the Si substrates, prepared by using the above four different solvents, are shown in the insets in (a), (c), (e) and (g) of FIG. 2, respectively. Discernible color differences were observed among four samples, which may be attributed to difference in thickness of the dielectric films. Average thicknesses of 190±5 nm, 265±5 nm, 367±13 nm, and 402±14 nm were extracted when spiro-MeOTAD was prepared with chlorobenzene, toluene, chloroform and dichloromethane, respectively. Detailed analyses showed that the obtained thicknesses were observed to correlate directly with boiling points ($T_B$) of the solvents. (See Table 1.) The dichloromethane solvent, which has the lowest $T_B$ of 39.6° C., generated the thickest spiro-MeOTAD film with a thickness of ~400 nm, whereas the chlorobenzene solvent with the highest $T_B$ of 132° C. generated the thinnest film with a thickness of ~190 nm.

As explained above, the present studies indicate that there is no correlation between the pinhole formation and the solvent's intrinsic properties. However, it is noted that a difference between the two sets of solvent products (between FIGS. 1 and 2) is the presence/absence of water and/or additives (i.e. secondary solvents) in the primary solvents. To test whether the presence of the secondary solvent in the primary solvent is a likely cause for the pinhole formation, control experiments were performed by intentionally adding small amounts of water in the primary solvents.

FIG. 3 shows the surface morphology of the spiro-MeOTAD films, with addition of 1 vol % and 5 vol % of deionized water (DI-$H_2O$, 18 MΩ·cm) in chlorobenzene, dichloromethane and chloroform. Specifically, FIG. 3 shows the tapping mode AFM topography images of the spin-coated spiro-MeOTAD films, prepared by using chlorobenzene from supplier A to which 1 vol % and 5 vol % of deionized water was added, in (a) and (b), respectively; using dichloromethane from supplier B to which 1 vol % and 5 vol % of deionized water was added, in (c) and (d), respectively; using chloroform from supplier B to which 1 vol % and 5 vol % of deionized water was added, in (e) and (f), respectively; and using chloroform from supplier B to which 5 and 20 vol% of amylene (2-methyl-2-butene) was added, in (g) and (h), respectively. It was observed that the chlorobenzene solvent absorbs more water molecules than the dichloromethane solvent or the chloroform solvent, as indicated by the formation of pinholes larger in size. Further experiments were conducted by intentionally adding small amounts of 2-methyl-2-butene (amylene), which is a well-known additive/stabilizer used in small amounts to extend product shelf life of chloroform or dichloromethane. Therefore, additionally, FIG. 3 shows the AFM topography images of the spiro-MeOTAD films, prepared by using chloroform (from supplier B) to which 5 vol % and 20 vol % of amylene was added (see FIG. 3(g)-(h)), respectively. Si substrates were used for all samples, and each image size is 5×5 µm², except for (c) and (d) with 10×10 µm².

The size distribution of pinholes was analyzed based on the AFM images shown in FIG. 3(a)-(h). FIG. 4 shows histograms depicting the trends in the distribution of pinhole diameters in the samples when a secondary solvent of $H_2O$ or amylene was added intentionally in a primary solvent of chlorobenzene, dichloromethane or chloroform. The histograms in FIG. 4(a)-(h) correspond to the AFM images in FIG. 3(a)-(h), respectively. Analyses based on the histograms in (a) and (b) show that the spin-coated spiro-MeOTAD films prepared by using the chlorobenzene primary solvent with 1 vol % and 5 vol % of the DI-$H_2O$ secondary solvent generated pinholes with average diameters of 93.2±78.5 nm and 118.2±102.9 nm, respectively. Analyses based on the histograms in (c) and (d) show that the spin-coated spiro-MeOTAD films prepared by using the dichloromethane primary solvent with 1 vol % and 5 vol % of the DI-$H_2O$ secondary solvent generated larger average diameters of 273±124 nm and 345±89 nm, respectively. On the other hand, analyses based on the histograms in (e) and (f) show that the spin-coated spiro-MeOTAD films prepared by using the chloroform primary solvent with the same amounts of 1 vol % and 5 vol % of the DI-$H_2O$ secondary solvent generated much smaller sizes of pinholes with average diameters of 45.2±16.5 nm and 43.8±17.8 nm, respectively. Analyses based on the histograms in (g) and (h) show that the spin-coated spiro-MeOTAD films prepared by using the chloroform primary solvent with 5 vol % and 20 vol % of amylene secondary solvent generated pinholes with average diameters of 41.8±8.8 nm and 68.3±21.0 nm, respectively. As shown in these histograms, the characteristic dimensions of the generated pinholes are on the order of 1-100 nm, less than 1 µm.

To check if the characteristics associated with the pinhole formation are specific to small organic molecules, such as spiro-MeOTAD, the same experiments as described above were conducted by using polystyrene, which is a polymer composed of long chains of hydrocarbon units. Various polystyrene solutions were spin-coated on Si substrates. FIG. 5 shows the tapping mode AFM topography images with each image size of 5×5 µm$^2$ of the spin-coated polystyrene films prepared by using chlorobenzene, dichloromethane, toluene and chloroform, respectively, in (a), (c), (e) and (g); and the tapping mode AFM topography images with each image size of 2×2 µm$^2$ of the spin-coated polystyrene films prepared by using chlorobenzene, dichloromethane, toluene and chloroform, respectively, in (b), (d), (f) and (h). All the solvents are from supplier B. Photos of the samples are shown in the insets. Similar to the case of using spiro-MeOTAD, discernible color differences are observed. Results based on extraction analyses are: thicknesses of 76±2 nm, 205±10 nm, 110±10 nm and 143±6 nm, when the polystyrene was dissolved in chlorobenzene, dichloromethane, toluene and chloroform, respectively. Similar to the case of using spiro-MeOTAD, the trends in the thickness correlate with $T_B$, where the solvent with the lowest $T_B$ (dichloromethane) generated the thickest polystyrene film, whereas the solvent with the highest $T_B$ (chlorobenzene) generated the thinnest film. A comparison experiment showed that the pinholes were visible in AFM when polystyrene was dissolved in chlorobenzene from supplier A. FIG. 6 shows the tapping mode AFM topography image with the image size 5×5 µm$^2$ of the spin-coated polystyrene film prepared by using chlorobenzene from supplier A. Si was used for the substrate.

Further AFM studies have been conducted, and data and photos are provided below for comparing the effects on pinhole formation arising from the type and amounts of the primary and secondary solvents.

FIG. 7 shows a series of the AFM images, with each image size 5×5 µm$^2$, of the spin-coated spiro-MeOTAD films prepared by using an off-the-shelf chlorobenzene product (from supplier A) as the solvent in (a), the chlorobenzene plus 1 vol % deionized-water in (b), the chlorobenzene plus 2 vol % deionized-water in (c), and the chlorobenzene plus 5 vol % deionized-water in (d). These AFM images show that the size of individual pinholes generally increases as the amount of deionized-water in the solvent increases. The RMS surface roughness was measured to be: 0.56 nm in (a), 1.27 nm in (b), 1.78 nm in (c) and 2.37 nm in (d).

FIG. 8 shows a series of the AFM images, with each image size 5×5 µm$^2$, of the spin-coated spiro-MeOTAD films prepared by using an off-the-shelf chloroform product (from supplier B) as the solvent in (a), the chloroform plus 1 vol % deionized-water in (b), the chloroform plus 2 vol % deionized-water in (c), and the chloroform plus 5 vol % deionized-water in (d). The RMS surface roughness was measured to be: 0.20 nm in (a), 0.21 nm in (b), 0.17 nm in (c) and 0.18 nm in (d). The AMF image in (a) shows no visible pinholes. Results of the statistical analyses show that the average diameter of pinholes is 106±36 nm and the density is 2 pinholes/m$^2$ in (b), the average diameter of pinholes is 89±20 nm and the density is 3 pinholes/m$^2$ in (c), and the average diameter of pinholes is 97±41 nm and the density is 2 pinholes/m$^2$ in (d).

FIG. 9 shows a series of the AFM images, with each image size 5×5 µm$^2$, of the spin-coated spiro-MeOTAD films prepared by using an off-the-shelf chloroform product (from supplier B, super dehydrated) as the solvent in (a), the chloroform plus 5 vol % amylene in (b), the chloroform plus 10 vol % amylene in (c), and the chloroform plus 20 vol % amylene in (d). As can be seen from these figures, incorporation of amylene leads to the formation of pinholes. The trend is such that as the amount of intentionally added amylene increases, the average diameter of pinholes becomes larger.

The present experiments and analyses described thus far indicate that there is no direct correlation between the generation of pinholes in a hole transport layer and the intrinsic physico-chemical properties of solvents used for dissolving the HTM. However, it is likely that off-the-shelf solvent products from different suppliers may contain different amounts and types of water and/or additives. The control experiments by adding intentionally small amounts of water or amylene (an additive commonly employed to prolong the solvent's shelf life) showed that the pinhole formation, size and distribution are closely related to the amounts of water and/or the additive. The above findings may not be unique to only small organic molecules, since pinholes were also observed when the HTM is polystyrene, a polymer composed of long chains of C and H atoms. Based on the present experimental results and analyses, the following mechanism is considered to be a cause for the formation of pinholes in a HTM film.

FIG. 10 illustrates a process sequence, Step 1-Step 3, schematically depicting the mechanism for the formation of pinholes. A solvent generally contains not only a primary solvent, such as chloroform, chlorobenzene, dichloromethane or the like, but also a small amount of a secondary solvent. The secondary solvent may be an intentionally incorporated additive or additives, such as a stabilizer to improve the solvent's stability and/or shelf life. The secondary solvent can be an unintentionally incorporated material, such as water that gets into the primary solvent when it is exposed to humid air, or when such humid air enters the container containing the primary solvent in storage. If the secondary solvent is immiscible with the primary solvent, and if the solute material has poor solubility in the secondary solvent, the secondary solvent remains in the form of small suspension drops in the solution. These small suspension drops comprise mainly the secondary solvent, separated from the solute material dissolved in the primary solvent. Step 1 illustrates that a solution is placed on a substrate, the solution comprising a HTM such as spiro-MeOTAD dissolved in a primary solvent and suspension drops mainly comprised of a secondary solvent. The solution is then spread on the substrate. Spin-coating can be performed for applying the solution onto the substrate, as illustrated in Step 2. Due to the spinning, the solution spreads over the substrate surface by the centrifugal force, and eventually the excess solution will fly away leaving the substrate with the amount of solution that can adhere to the substrate. The suspension drops mostly comprising the secondary solvent in the spin-coated material will result in pinholes in the coated film, as illustrated in Step 3. During the spinning of the sample, the complex physico-chemical dynamic processes of the secondary solvent incorporated in the primary solvent are expected to generate not only simple pinholes formed in the proximity of the top surface of the coated film, but also more complex wiggling channels within the film.

Therefore, pinholes in a HTM may be formed based on the following factors: (i) the primary and secondary solvents are immiscible with each other; (ii) the solubility of the solute material (i.e., a HTM such as spiro-MeOTAD in the present examples) is higher in the primary solvent than in the secondary solvent. As mentioned earlier, examples of HTMs include spiro-MeOTAD, polystyrene, P3H, PTAA, etc. The solubility of one substance in another is determined mainly by the balance of intermolecular forces between the solvent and solute, and is known for a wide variety of combinations of solvents and solute materials. Alternatively, solubility can be measured for a wide variety of combinations prior to using the specific materials selected. Therefore, it is possible to form pinholes in a controlled manner, primarily by adjusting the types and amounts of the primary and secondary solvents once the specific HTM is selected.

To utilize the pinhole formation in a HTM for patterning and functionalization of surfaces, additional experiments were performed in the present studies. FIG. 11 illustrates an example process of replicating a surface pattern generated by the controlled formation of pinholes in a HTM. Specifically, the HTM film containing pinholes is used as a mold to produce a stamp. In (a), the spiro-MeOTAD film is formed on the substrate, the film including pinholes with predetermined approximate sizes and density as controlled by the process described with reference to FIG. 10. The substrate may be a typical Si(001), for example. It should be understood that the sizes and density of pinholes may be given in approximate values, and may be predetermined statistically within certain error bars based on empirical data, manufacturers' specifications and/or physico-chemical properties of the solute material (i.e., the HTM), the primary solvent and the secondary solvent. The empirical data may be obtained via experiments and analyses, such as those based on AFM topography, by using different types and amounts of primary and secondary solvents and solute material, changing the spin speed and time, using different types and sizes of the substrate, and other physical, chemical and mechanical parameters in the pinhole formation process. It is noted that once the solute material and the substrate are selected, e.g., spiro-MeOTAD as a HTM and Si as a substrate, the remaining key parameters are the types and amounts of the primary and secondary solvents.

Replication of the surface pattern of the spiro-MeOTAD film containing pinholes was performed by using CYTOP™. CYTOP is an amorphous fluoropolymer, which has good solubility in certain fluorinated solvents but is insoluble with most typical solvents due to its specific amorphous structure. This, coupled with its thermoplastic characteristics, makes it suitable for use as a dielectric coating with a thickness less than 1 µm for various electronic materials. In the present experiment, a solution of CYTOP was prepared by mixing two CYTOP products both purchased from a commercial supplier. Various application methods are available, such as spin, dip, spray and die-coat. Other materials that may be used to replicate the surface pattern include: Teflon, which is another example of an amorphous fluoropolymer, poly (methyl methacrylate) (PMMA), which is a transparent thermoplastic polymer, and Sylgard™ 184, which is a silicone elastomer. These candidate materials for replicating the surface pattern are generally thermoplastic polymers.

As illustrated in FIG. 11, CYTOP was used as a replicating material in the present experiment to be spin-coated on the spiro-MeOTAD layer that has pinholes. Specifically, the solution of CYTOP was spin-coated on the spiro-MeOTAD film at 1000 rpm for 60 seconds and subsequently heated at ~100° C. for 30 min for drying, resulting in a thin-film coating of CYTOP on the spiro-MeOTAD film. Methods other than spin-coating can be performed for applying the coating material over the spiro-MeOTAD film containing pinholes. Possible application methods include: spin, dip, spray and die-coat. CYTOP can be dissolved in a specific fluorinated solvent, which is orthogonal to spiro-MeOTAD. That is, the CYTOP solution does not dissolve spiro-MeOTAD. Instead of spiro-MeOTAD, any of the HTMs such as those listed earlier may be used to form a mold. Instead of the CYTOP solution, any material orthogonal to a chosen mold material may be used. After the spin-coating of CYTOP over the spiro-MeOTAD film containing pinholes, the sample is dried and the dried CYTOP layer is delaminated, as shown in (c) and (d). The back surface of the delaminated CYTOP can be attached to a Si substrate or any suitable support plate for ease of use as a stamp.

FIG. 12 shows the tapping mode AFM topography images of the spiro-MeOTAD film containing pinholes in (a), which was formed according to the process illustrated in FIG. 10, and a replica of the pinhole structure transferred to the CYTOP film in (b), which was formed according to the process illustrated in FIG. 11. Each image size is 10×10 µm$^2$.

FIG. 13 shows example results of the AFM analyses of pinhole depths in the spiro-MeOTAD film containing pinholes in (a) and rod heights in the replica made in the CYTOP film in (b). In (a), the top figure is a plot showing the measured horizontal and vertical dimensions of four pinholes with the average depth of 37±5 nm in the spiro-MeOTAD film; the bottom left figure is a perspective view of the AFM image of the spiro-MeOTAD film with the image size of 5.0×5.0 µm$^2$ including the four pinholes; and the bottom right figure is the AFM image with the image size of 5.0×5.0 µm$^2$ including the four pinholes, each indicated with the horizontal measurement direction with the length of 1.5 µm. In (b), the top figure is a plot showing the measured horizontal and vertical dimensions of four rods with the average height of 16.5±3.2 nm in the CYTOP film; the bottom right figure is a perspective view of the AFM image of the CYTOP film with the image size of 5.0×5.0 µm$^2$ including the four rods; and the bottom left figure is the AFM image with the image size of 5.0×5.0 µm$^2$ including the four rods, each indicated with the horizontal measurement direction with the length of 1.5 µm.

The present AFM measurements confirmed that the pinhole structure in the spiro-MeOTAD film was replicated by being translated to protruded rods formed on the surface of the CYTOP film. Thus, in the present process, the spiro-MeOTAD film with pinholes serves as a mold, and the delaminated CYTOP film serves as a stamp that can be used to create patterned surfaces in nanoscale patterning or other applications. Here, the nanoscale is defined to be on the order of 1-100 nm, i.e., less than 1 μm. As shown in the histograms of the pinhole diameter in FIG. 4 as well as in the analysis results in FIG. 13, the pinholes and the rods in the replica can be formed with the characteristic dimensions on the order of 1-100 nm, less than 1 μm, according to the present method.

Examples of existing patterning methods include microcontact printing, which is a surface patterning method involving a photolithography technique to first pattern a hard silicon master as a mold. In photolithography, the surface of a silicon wafer is coated with a photoresist film sensitive to UV light, which is then exposed to light through a metal photomask. The light passes the mask through the non-metalized areas, generating the area-sensitive polymerization (or degradation) of the photoresist film according to the predetermined pattern on the mask. In this printing method, polydimethylsiloxane (PDMS), for example, can be used to replicate the pattern from the mold to another substrate, based on self-assembled monolayer formation of thiols on gold, for example, providing an etch-resist layer, similar to the photoresist in photolithography. Another example is a method wherein block copolymers are used to generate periodic nanoscale structures by making use of microphase-separation. A block copolymer is a copolymer composed of a sequence or blocks, of chemically distinct repeating units originated from two or more different monomers united together to polymerize. The synthesis and thin-film assembly of a triblock terpolymer has been reported to generate nanoscale ring patterns, which are transferred into another polymeric layer by imprinting. Yet another example is a method that makes use of the lateral phase separation between two immiscible polymers to generate nanoscale patterns. In an example process in this method, a mixture of polystyrene (PS) and polymethylmethacrylate (PMMA) dissolved in methylethylketone (MEK) is spin-coated on a substrate, resulting in PS droplets in a PMMA matrix. A subsequent selective dissolution of either the PS or PMMA component leaves behind a nanostructured film, which can be used as a lithographic mask to fabricate metal patterns by thermal evaporation of the metal, followed by a lift-off process. In general, these and other existing methods of patterning are complex due to multiple steps involved in the process.

In optoelectronics applications including perovskite for an active layer, the pinholes generated in a hole transport layer are defects degrading device performances. However, according to the present studies, the formation of pinholes in a hole transport material can be positively utilized to generate a nanoscale surface pattern and its replica. As described earlier, the pinhole formation can be controlled primality by adjusting the types and amounts of the primary (first) and secondary (second) solvents. A spin-coating method generally provides an easy and fast procedure for the thin-film synthesis. The present method of nanoscale patterning comprises: mixing predetermined amounts of a first solvent and a second solvent to generate a solvent, the first solvent and the second solvent being immiscible with each other; dissolving a solute material in the solvent to generate a coating material, the solute material having solubility that is higher in the first solvent than in the second solvent; and applying the coating material onto a substrate to form a plurality of pinholes in the coating material. The formation of the plurality of pinholes is associated with suspension drops mostly comprised of the second solvent, separated from the solute material dissolved in the first solvent, in the coating material. A method of making a stamp with a nanoscale pattern is based on the above method and includes: applying a replicating material onto the coating material containing the plurality of pinholes to replicate a pattern of a surface of the coating material containing the plurality of pinholes onto a surface of the replicating material; and delaminating the replicating material from the coating material. The delaminated replicating material is then configured for use for a stamp. Therefore, compared to existing methods that usually require multiple steps and expensive instrumentation (e.g., photolithography equipment), the present method is straightforward and inexpensive. The present method is further characterized by its compatibility with scaling up and large area productions. For this, slot-die coating may be used instead of spin-coating. The present method can be performed at low temperatures and in the ambient pressure, without requiring expensive vacuum systems.

While this document contains many specifics, these should not be construed as limitations on the scope of an invention or of what may be claimed, but rather as descriptions of features specific to particular embodiments of the invention. Certain features that are described in this document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be exercised from the combination, and the claimed combination may be directed to a subcombination or a variation of a subcombination.

The invention claimed is:

1. A method of making a stamp having a nanoscale pattern, the method comprising:
   mixing predetermined amounts of a first solvent and a second solvent to generate a solvent, the first solvent and the second solvent being immiscible with each other;
   dissolving a solute material in the solvent to generate a coating material, the solute material having solubility that is higher in the first solvent than in the second solvent;
   applying the coating material onto a substrate to form a plurality of pinholes in the coating material;
   applying a replicating material onto the coating material containing the plurality of pinholes to replicate a pattern of a surface of the coating material containing the plurality of pinholes onto a surface of the replicating material; and
   delaminating the replicating material from the coating material for using the surface of the delaminated replicating material as the surface of the stamp.

2. The method of claim 1, wherein
   the applying the coating material comprises spin-coating the coating material on the substrate.

3. The method of claim 1, wherein
   the applying the replicating material onto the coating material comprises spin-coating the replicating material on the coating material containing the plurality of pinholes, followed by drying the replicating material.

4. The method of claim 1, wherein the formation of the plurality of pinholes is associated with suspension drops comprised of the second solvent, separated from the solute material dissolved in the first solvent, in the coating material.

5. The method of claim 1, further comprising attaching a support plate to a back surface of the delaminated replicating material for use as the stamp.

6. The method of claim 1, wherein the solute material comprises a hole transport material used for forming a hole transport layer in a perovskite optoelectronic device.

7. The method of claim 6, wherein the hole transport material comprises spiro-MeOTAD or polystyrene.

8. The method of claim 1, wherein the first solvent comprises chlorobenzene, chloroform, dichloromethane or toluene.

9. The method of claim 1, wherein the second solvent comprises water, a stabilizer or both.

10. The method of claim 9, wherein the stabilizer comprises amylene.

11. The method of claim 1, wherein the replicating material is orthogonal to the coating material, wherein the replicating material does not dissolve the coating material.

12. The method of claim 1, wherein the replicating material comprises a thermoplastic polymer.

13. The method of claim 12, wherein the thermoplastic polymer comprises an amorphous fluoropolymer, PMMA or a silicone elastomer.

14. The method of claim 1, wherein the plurality of pinholes have dimensions on the order of 1-100 nm.

15. A method of nanoscale patterning, the method comprising:
mixing predetermined amounts of a first solvent and a second solvent to generate a solvent, the first solvent and the second solvent being immiscible with each other;
dissolving a solute material in the solvent to generate a coating material, the solute material having solubility that is higher in the first solvent than in the second solvent; and
applying the coating material onto a substrate to form a plurality of pinholes in the coating material,
wherein the formation of the plurality of pinholes is associated with suspension drops comprised of the second solvent, separated from the solute material dissolved in the first solvent, in the coating material, the plurality of pinholes providing the nanoscale patterning on a surface of the coating material.

16. The method of claim 1, wherein the surface of the stamp has a nanoscale pattern associated with a plurality of rods on the surface of the delaminated replicating material corresponding to the plurality of pinholes contained in the coating material,
the plurality of rods have dimensions on the order of 1-100 nm, and
the nanoscale pattern is controlled by types and amounts of the first solvent and the second solvent.

17. The method of claim 15, wherein the plurality of pinholes have dimensions on the order of 1-100 nm.

18. The method of claim 15, wherein the nanoscale patterning comprises a plurality of rods corresponding to the plurality of pinholes contained in the coating material,
the plurality of rods have dimensions on the order of 1-100 nm, and
he nanoscale patterning is controlled by types and amounts of the first solvent and the second solvent.

* * * * *